(12) United States Patent
Lee et al.

(10) Patent No.: US 7,999,839 B2
(45) Date of Patent: Aug. 16, 2011

(54) LASER IRRADIATION APPARATUS AND METHOD OF FABRICATING ORGANIC LIGHT EMITTING DISPLAY USING THE SAME

(75) Inventors: Jae-Ho Lee, Suwon-si (KR); Tae-Min Kang, Suwon-si (KR); Seong-Taek Lee, Suwon-si (KR); Jin-Soo Kim, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 192 days.

(21) Appl. No.: 12/426,821

(22) Filed: Apr. 20, 2009

(65) Prior Publication Data
US 2009/0202950 A1 Aug. 13, 2009

Related U.S. Application Data

(62) Division of application No. 11/020,670, filed on Dec. 27, 2004, now Pat. No. 7,542,063.

(30) Foreign Application Priority Data

Sep. 21, 2004 (KR) .................... 10-2004-0075657

(51) Int. Cl.
*B41J 2/47* (2006.01)
(52) U.S. Cl. ...................................... 347/241
(58) Field of Classification Search .................. 347/130, 347/134, 136, 241, 244, 256, 258
See application file for complete search history.

(56) References Cited

U.S. PATENT DOCUMENTS

| | | | |
|---|---|---|---|
| 5,935,758 A | 8/1999 | Patel et al. | |
| 6,331,885 B1 | 12/2001 | Nishi | |
| 6,414,743 B1 | 7/2002 | Nishi et al. | |
| 6,424,405 B2 | 7/2002 | Kurosawa et al. | |

(Continued)

FOREIGN PATENT DOCUMENTS

JP 2000-019712 1/2000

(Continued)

OTHER PUBLICATIONS

Machine-generated translation of JP 2004-230458, published on Aug. 2004.*

*Primary Examiner* — Huan H Tran
(74) *Attorney, Agent, or Firm* — H.C. Park & Associates, PLC

(57) ABSTRACT

Provided are a laser irradiation apparatus and method of fabricating an organic light emitting display using the same. The laser irradiation apparatus includes a mask positioned below the laser generator, and the mask is patterned such that lengths of an upper portion and a lower portion of a mask pattern are patterned longer than a length of a middle portion of the mask pattern with respect to the scanning direction. The method of fabricating an organic light emitting display includes scanning a laser beam on a predetermined region of the donor substrate using the laser irradiation apparatus to form an organic layer pattern on the substrate. When the organic layer pattern is formed using a laser induced thermal imaging (LITI) method, the transfer may be carried out using a laser beam having low energy, laser beam efficiency may be enhanced, the organic layer may be less damaged, and the quality of the organic layer pattern to be transferred may also be enhanced.

8 Claims, 15 Drawing Sheets

U.S. PATENT DOCUMENTS

| | | |
|---|---|---|
| 6,577,380 B1 | 6/2003 | Sposili et al. |
| 6,582,875 B1 * | 6/2003 | Kay et al. ............... 430/200 |
| 7,303,850 B2 * | 12/2007 | Lee et al. ............... 430/200 |
| 7,525,563 B2 * | 4/2009 | Lee et al. ............... 347/241 |
| 7,537,878 B2 * | 5/2009 | Song et al. ............... 430/199 |
| 2003/0194613 A1 | 10/2003 | Voutsas |
| 2007/0141942 A1 * | 6/2007 | Kawaguchi et al. ......... 445/2 |
| 2009/0181328 A1 * | 7/2009 | Lee et al. ............... 430/319 |

FOREIGN PATENT DOCUMENTS

| | | |
|---|---|---|
| JP | 2001-326190 | 11/2001 |
| JP | 2003-077658 | 3/2003 |
| JP | 2003-257638 | 9/2003 |
| JP | 2003-272843 | 9/2003 |
| JP | 2004-230458 * | 8/2004 |
| KR | 10-2006-0019451 | 3/2006 |

* cited by examiner

LASER IRRADIATION APPARATUS AND METHOD OF FABRICATING ORGANIC LIGHT EMITTING DISPLAY USING THE SAME

CROSS-REFERENCE TO RELATED APPLICATIONS

This application is a divisional application of U.S. patent application Ser. No. 11/020,670, filed on Dec. 27, 2004, and claims priority to and the benefit of Korean Patent Application No. 2004-0075657, filed Sep. 21, 2004, the disclosure of which are both incorporated herein by reference in their entirety.

BACKGROUND OF THE INVENTION

1. Field of the Invention

The present invention relates to a laser irradiation apparatus and method of fabricating an organic light emitting display using the same and, more particularly, to a laser irradiation apparatus including a mask in which a length of a middle portion of a mask pattern is patterned to be longer than those of an upper portion and a lower portion of the mask pattern on the basis of a scanning direction, and method of fabricating an organic light emitting display using the same

2. Description of the Related Art

In general, an organic light emitting display, which is a flat panel display, includes an anode, a cathode, and organic layers between the anode and the cathode. The organic layers include at least an emission layer. The organic layers may further include a hole injection layer, a hole transport layer, an electron transport layer, and an electron injection layer, in addition to the emission layer. The organic light emitting display may be classified into a polymer organic light emitting display and a small molecule organic light emitting display depending on the organic layer, particularly, a material that forms the emission layer.

In order to realize a full color organic light emitting display, it is required to pattern the emission layer. A method of patterning the emission layer includes a method using a shadow mask in the small molecule organic light emitting display, and an ink-jet printing method or a laser induced thermal imaging (hereinafter, referred to as LITI) method in the polymer organic light emitting display. With the LITI method, it is possible to finely pattern the organic layer. The LITI method is usable for a large-sized display and is advantageous in high resolution. Advantageously, the LITI method is a dry process, unlike the ink-jet printing that is a wet process.

FIG. 1 is a cross-sectional view illustrating a method of forming an organic layer pattern using an LITI method.

Referring to FIG. 1, a donor substrate 120 where an organic layer 130 is formed is laminated on a substrate 110 where a predetermined element is formed. When a laser beam 150 is irradiated on a predetermined region of the donor substrate 120 having the organic layer 130, the laser beam 150 is absorbed by a light-to-heat conversion layer of the donor substrate 120 and then converted to thermal energy, which allows the organic layer 130 forming a transfer layer to be transferred onto the substrate 110, thus patterning the organic layer on the substrate 110. In this case, the organic layer 130 is separated from the donor substrate 120 by the thermal energy, and is transferred onto the substrate 110 while bonding within the organic layer 130 is broken. Energy required to break the bonding within the organic layer 130 should be higher than energy required to allow the organic layer 130 to be broken from the donor substrate 120 and transferred. Dotted portions indicate portions where the bonds within the organic layer 130 are broken.

FIGS. 2A to 2C are schematic views illustrating a method of fabricating an organic light emitting display using a conventional laser irradiation apparatus.

Referring to FIG. 2A, a donor substrate 120 where an organic layer 130 is formed is laminated on a substrate 110 where a pixel electrode is formed.

The laser irradiation apparatus 200 includes a laser generator 240, a patterned mask 260, and a projection lens 270. The laser generator 240 irradiates a laser beam 250 on a predetermined region of the donor substrate 120, and performs scanning in an arrow direction. In this case, the laser beam 250 irradiated from the laser generator 240 penetrates the patterned mask 260, and the penetrated laser beam 250 is focused by the projection lens 270 and then irradiated on the donor substrate 120. The laser beam 250 is shielded from a portion where the mask 260 is not patterned.

Referring to FIG. 2B, the laser beam 250 performs scanning on the donor substrate 120 including a region where the pixel electrode 210 is formed. An oblique line portion indicates a region 255 on which the laser beam 250 performs scanning.

By means of the scanning of the laser beam 250, the organic layer 130 on the donor substrate 120 is transferred onto the substrate 110 where the pixel electrode 210 is formed. After the transfer process, a cathode is formed on the organic layer pattern, thereby completing the fabrication of the organic light emitting display.

Referring to FIG. 2C, the amount of laser irradiated on a scanning region while the laser beam is scanned is shown as a beam profile 280 of the laser beam 250 irradiated on the donor substrate 120. An x-axis indicates a region where the laser beam is scanned and a y-axis indicates energy of the laser beam. In particular, the amount of the laser beam irradiated on the scanning region of the donor substrate 120 is uniform. That is, it can be seen that the laser beam is uniformly irradiated over the entire region of the donor substrate 120 where the laser beam is irradiated. As shown in FIG. 1, energy required to break the bonding within the organic layer 130 should be higher than that required for allowing the organic layer 130 to be separated from the donor substrate 120 and transferred. As a result, energy required for breaking the bonding within the organic layer 130 is applied in order to transfer the organic layer 130. That is, an excessive amount of energy may be applied to transfer the organic layer 130, which may cause the organic layer to be damaged and the quality of the transferred organic layer pattern to be degraded.

SUMMARY OF THE INVENTION

The present invention, therefore, solves aforementioned problems associated with the conventional art by providing a laser irradiation apparatus, which is capable of allowing an organic layer to be transferred, a damage of the organic layer to be reduced, and a quality of a transferred organic layer pattern to be enhanced by means of a laser beam having low energy when the organic layer pattern is formed using LITI method, and method of fabricating an organic light emitting display using the same.

In an exemplary embodiment according to the present invention, a laser irradiation apparatus includes: a laser generator; and a mask positioned below the laser generator, wherein the mask is formed such that lengths of an upper portion and a lower portion of a mask pattern are patterned longer than a length of a middle portion of the mask pattern with respect to the scanning direction. As a result, the organic layer may be transferred using a laser beam having low energy.

In addition, the apparatus may further include a projection lens positioned below the mask.

In another exemplary embodiment according to the present invention, a method of fabricating an organic light emitting display includes: providing a substrate where a pixel electrode is formed; laminating a donor substrate on a surface of the substrate, and scanning a laser beam on a predetermined region of the donor substrate using the laser irradiation apparatus to form an organic layer pattern on the substrate.

The organic layer pattern may be a single layer or a multilayer of at least two layers selected from a group consisting of an emission layer, a hole injection layer, a hole transport layer, an electron transport layer and an electron injection layer.

The mask pattern may be formed to be a | shape. The shape of the mask pattern may be formed with at least one side being opened, preferably, may be formed as any one among ⊏, ⊐, ⊏⊏ and ⊐⊐. Alternatively, the mask may be employed such that a center of the middle portion of the mask pattern is not patterned, and the mask may be patterned in various shapes.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 3:
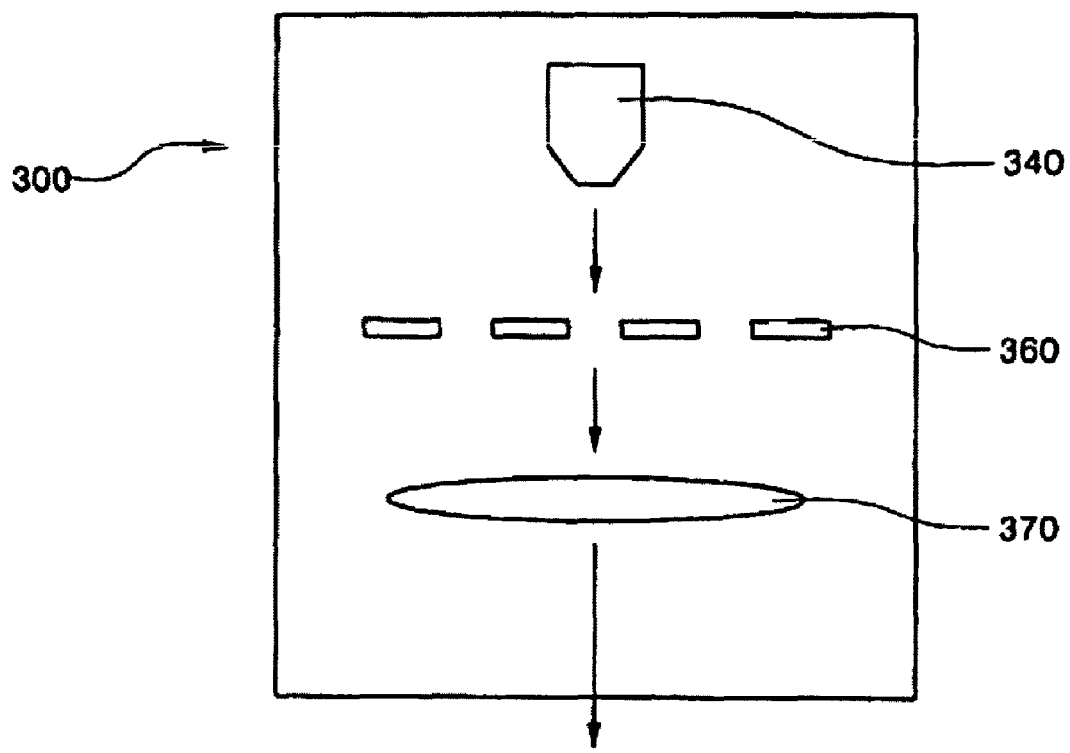
FIG. 3 is a schematic view illustrating a laser irradiation apparatus in accordance with the present invention.

FIG. 3 is a schematic view illustrating a laser irradiation apparatus in accordance with the present invention.

Referring to FIG. 3, a laser irradiation apparatus 300 includes a laser generator 340, a patterned mask 360 positioned below the laser generator 340, and a projection lens 370. A beam shaping device may be further included between the laser generator 340 and the patterned mask 360 which acts to make a laser beam irradiated from the laser generator 340 uniform.

The mask 360 is formed such that lengths of an upper portion and a lower portion of the mask pattern are patterned longer than a length of a middle portion of the mask pattern on the basis of a scanning direction. A detail description will be made with reference to FIGS. 4A to 4H.

FIGS. 4A to 4H are plan views of masks having various pattern shapes provided in a laser irradiation apparatus in accordance with the present invention.

Figure 4A:
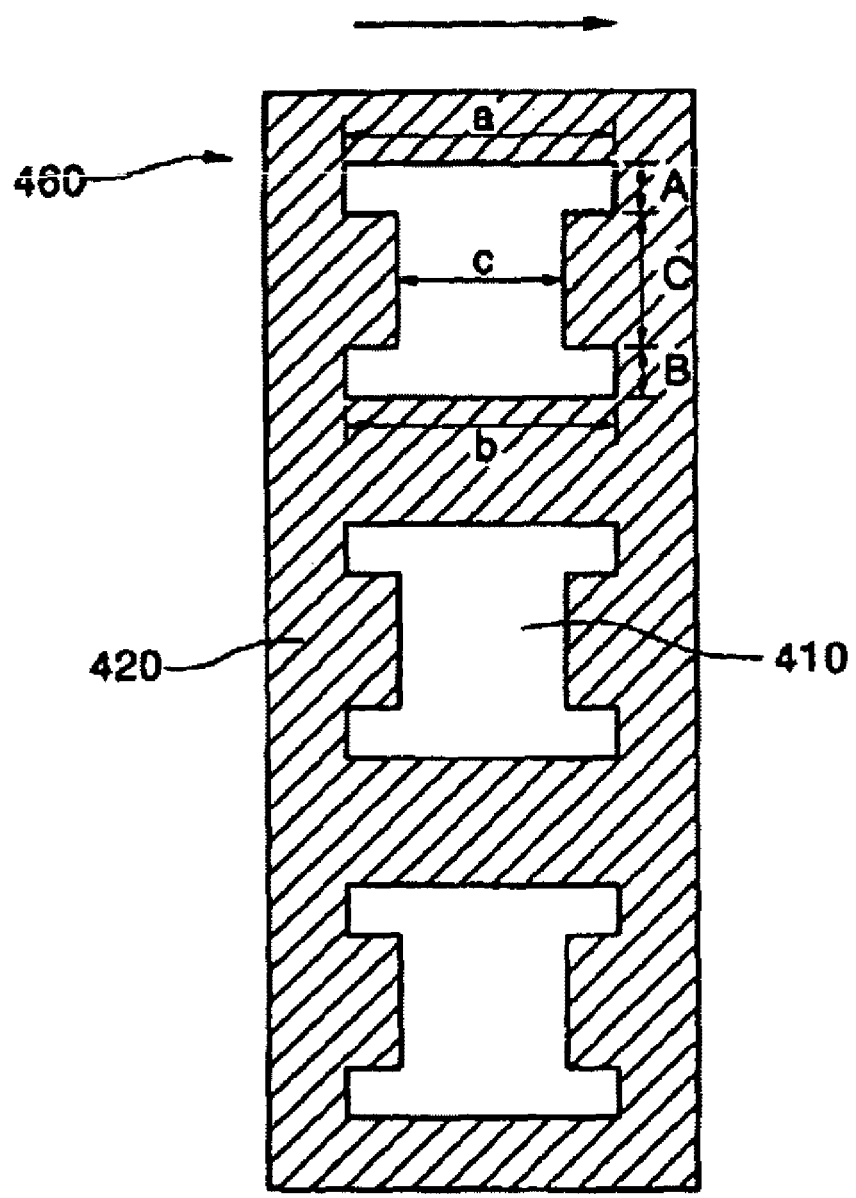
FIGS. 4A to 4H are plan views of masks having various pattern shapes provided in a laser irradiation apparatus in accordance with the present invention.
Figure 4B:
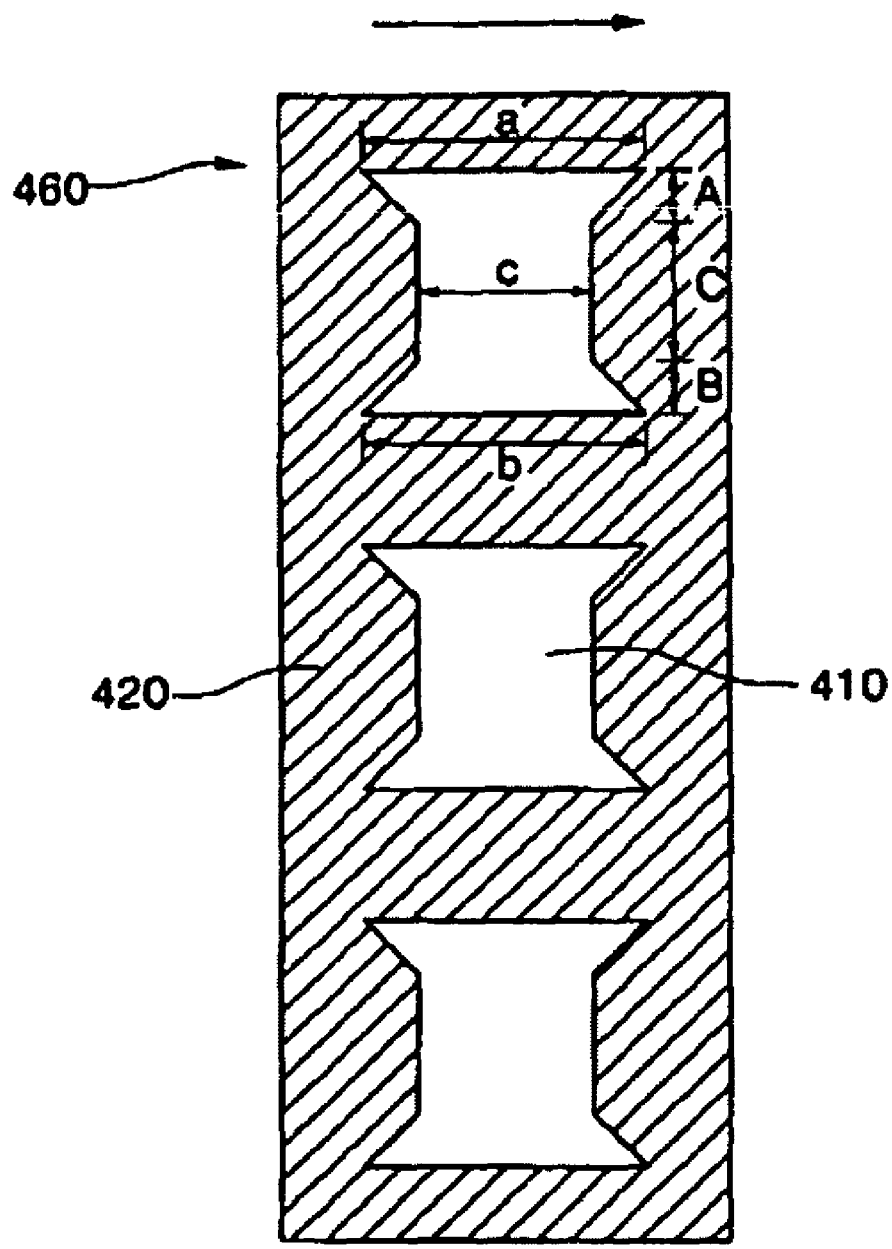

Referring to FIGS. 4A and 4B, the mask is patterned to have a | shape. The mask pattern may be divided into an upper portion A, a lower portion B, and a middle portion C. With respect to a direction vertical to the scanning direction, a length of the middle portion C of the mask pattern is formed longer than that of a region to be transferred when an organic layer is formed using the LITI method.

The lengths a and b of the upper portion and the lower portion of the mask pattern are patterned longer than a length c of the middle portion of the mask pattern on the basis of the scanning direction. Accordingly, when a laser beam is scanned as described later, an amount of laser beam energy irradiated onto the upper portion A and the lower portion B of the mask pattern may be larger than an amount of the laser beam energy irradiated onto the middle portion C of the mask pattern.

A hatched portion 420 denotes a region where the laser beam is not penetrated but blocked, and the laser beam penetrates the patterned region 410 to be irradiated.

Three mask patterns are formed in the patterned mask 460. However, this is just an illustrative example, and a required number of mask patterns may be formed.

The mask pattern having an | shape as shown in FIG. 4B has the upper portion A and the lower portion B which are obliquely patterned. The remaining structure is same as the mask pattern shown in FIG. 4A.

Referring to FIGS. 4C to 4F, at least one side of the mask is opened when seen from its plan view. Preferably, the mask is patterned to have ⊏, ⊐, ⊏⊏, or ⊐⊐ shape.

Figure 4C:
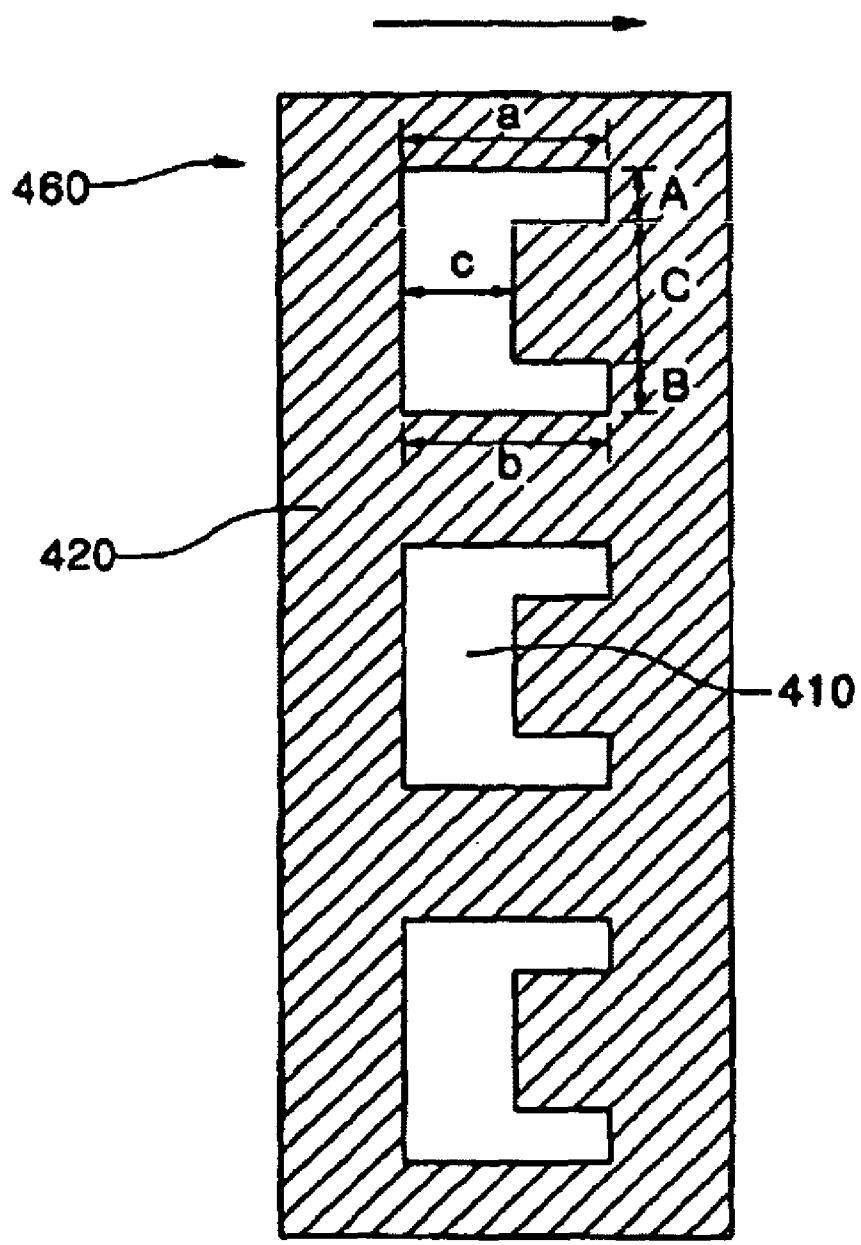
Figure 4D:
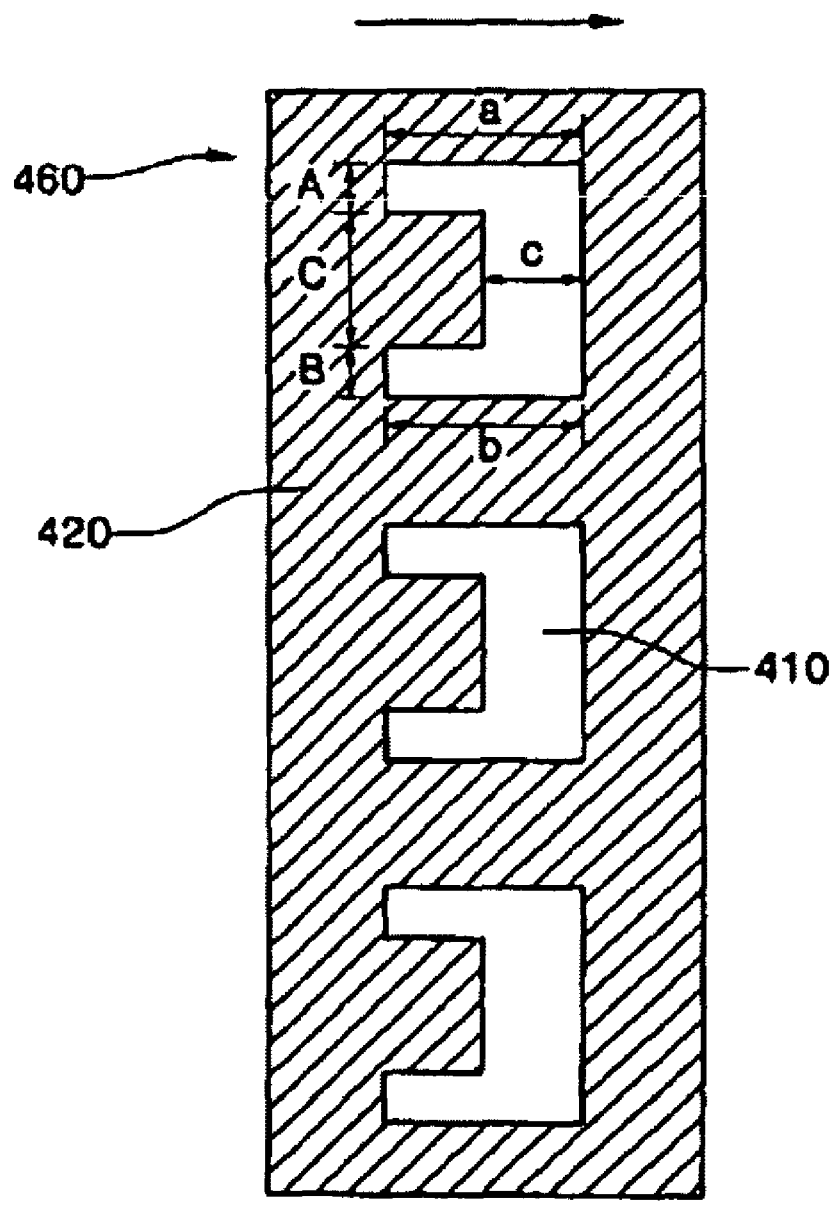

Referring to FIGS. 4C and 4D, with respect to the scanning direction, the length c of the middle portion of the mask pattern is shorter than the lengths a and b of the upper and lower portions of the mask pattern, however, the mask pattern is formed such that one side of the middle portion C of the mask pattern is short to be ⊏ shaped and ⊐ shaped, respectively.

Figure 4E:
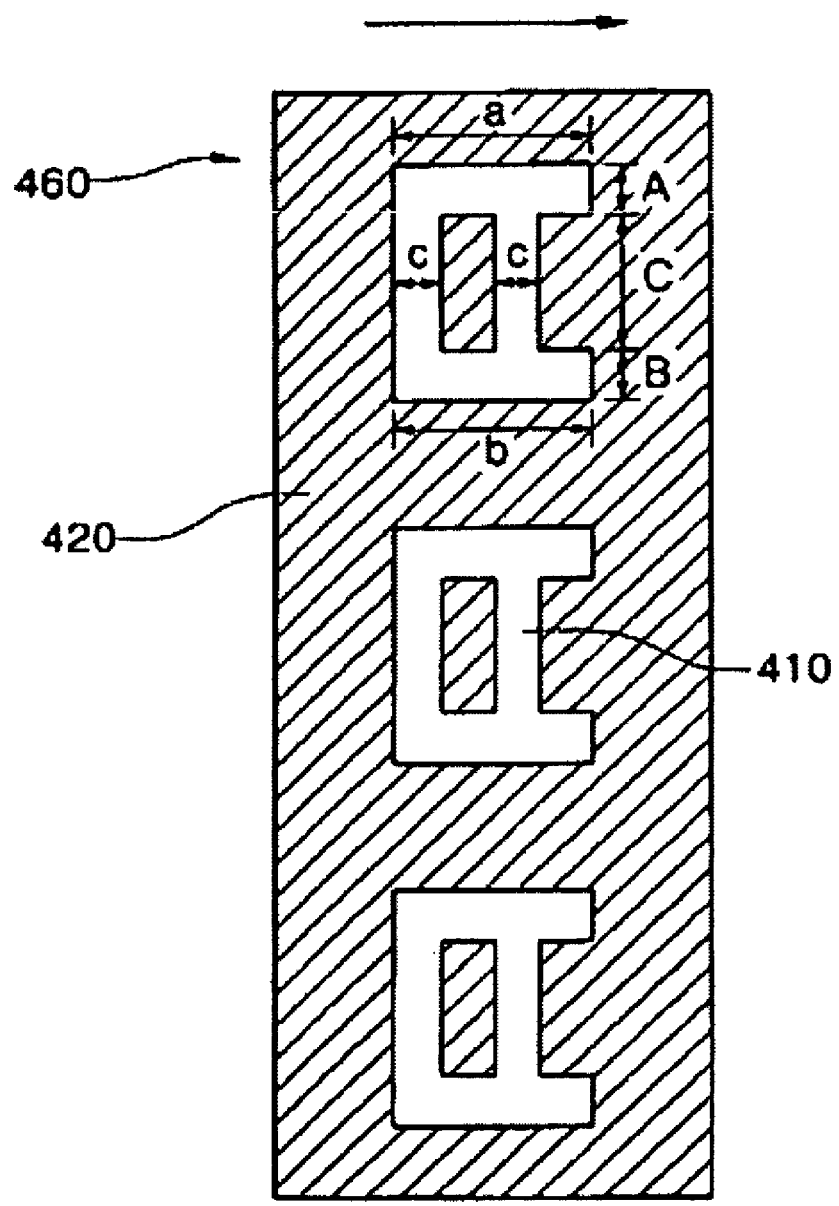
Figure 4F:
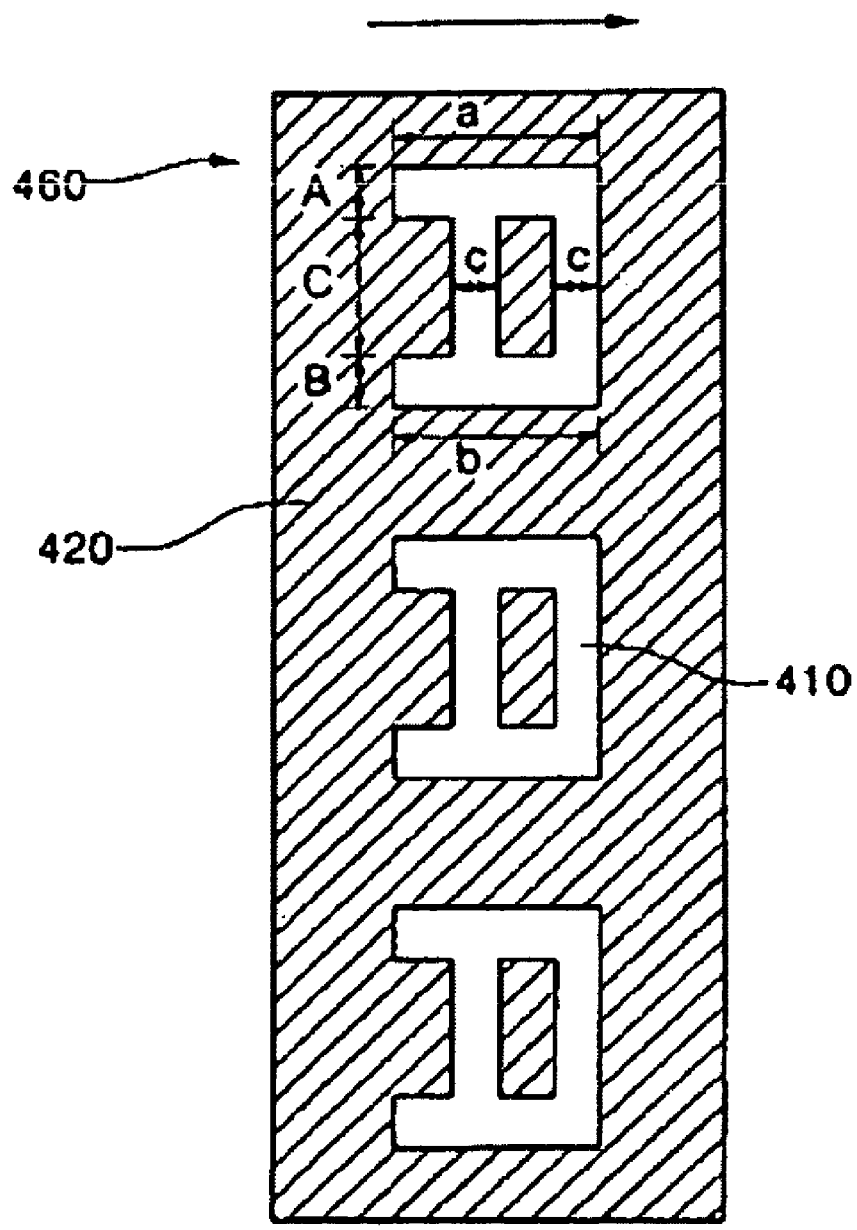

Referring to FIGS. 4E and 4F, with respect to the scanning direction, the summed length c of the middle portion of the mask pattern is shorter than the lengths a and b of the upper and lower portions of the mask pattern so that the mask has a ⊏⊏ shape or a ⊐⊐ shape.

The rest of the structures are the same as the mask pattern shown in FIG. 4A.

Figure 4G:
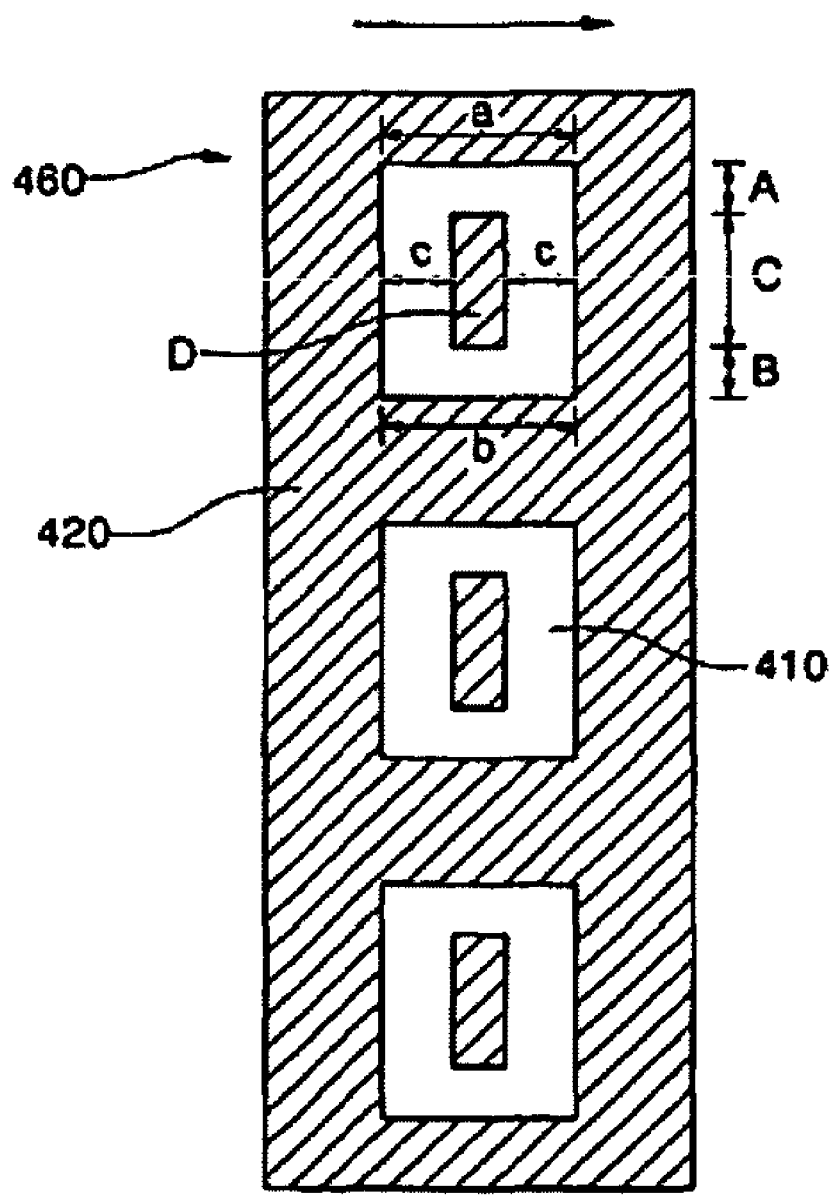
Figure 4H:
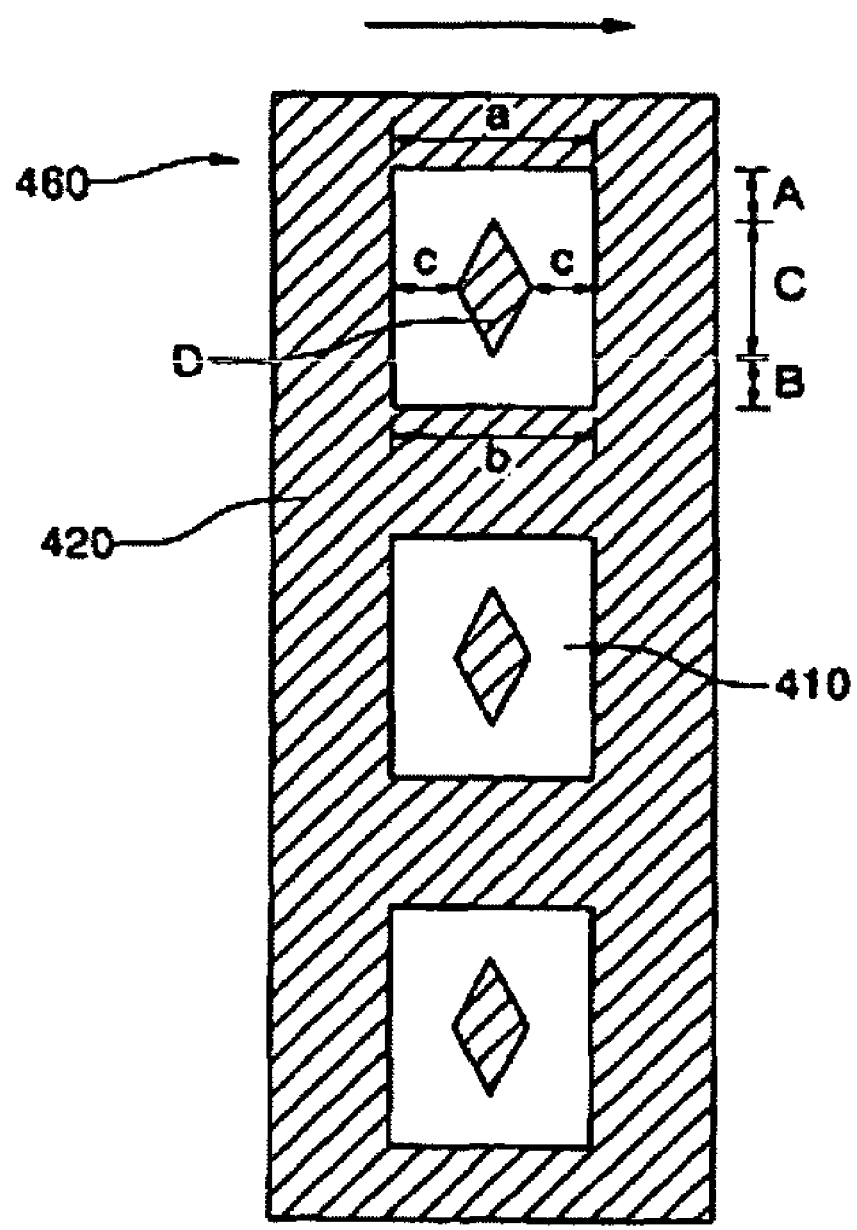

Referring to FIGS. 4G and 4H, the center D of the middle portion C of the mask pattern is not patterned. With respect to the scanning direction, the lengths a and b of the upper and lower portions of the mask pattern are patterned longer than the summed length c of the middle portion of the mask pattern. The center D of the middle portion C of the mask pattern is shown as a rectangle in FIG. 4G and as a lozenge in FIG. 4H. The rest of the structures are the same as the mask pattern shown in FIG. 4A.

FIGS. 5A to 5D are schematic views illustrating a method of fabricating an organic light emitting display using a laser irradiation apparatus in accordance with the present invention.

Figure 5A:
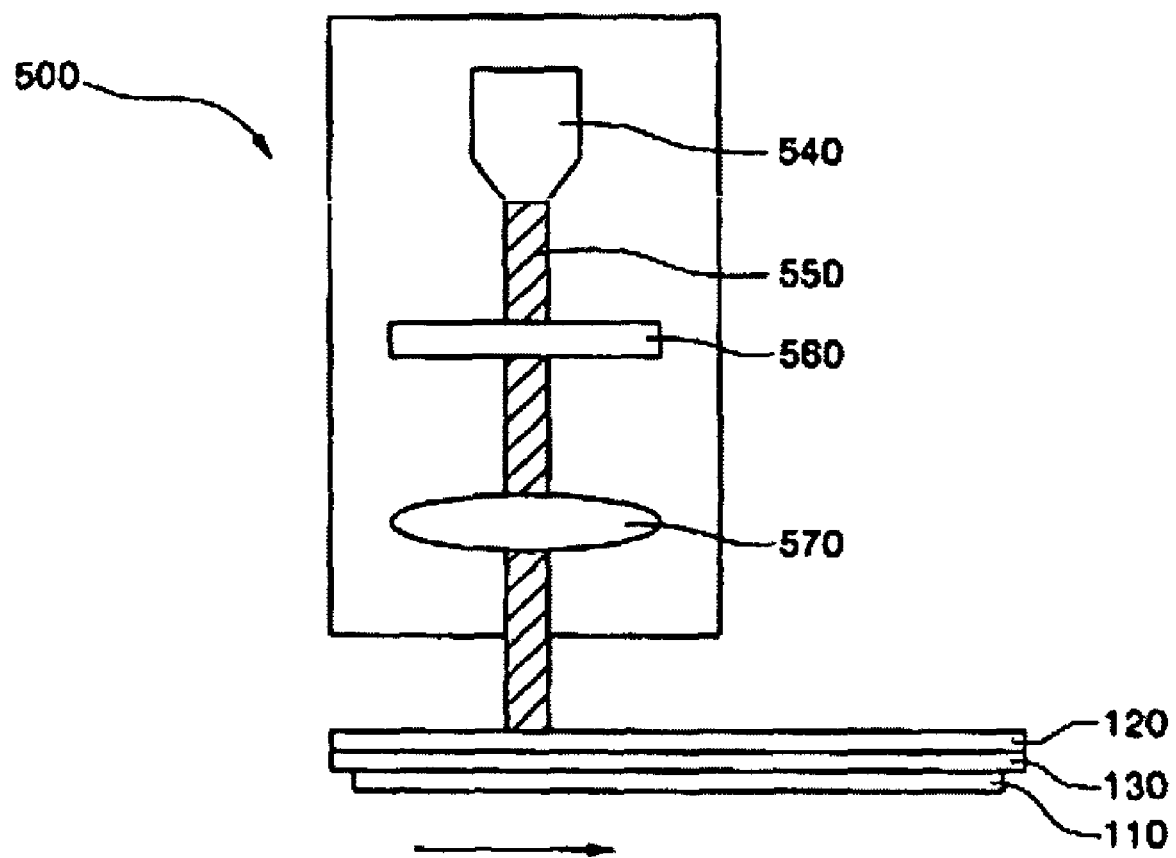
FIGS. 5A to 5D are schematic views illustrating a method of fabricating an organic light emitting display using a laser irradiation apparatus in accordance with the present invention.
Figure 5B:
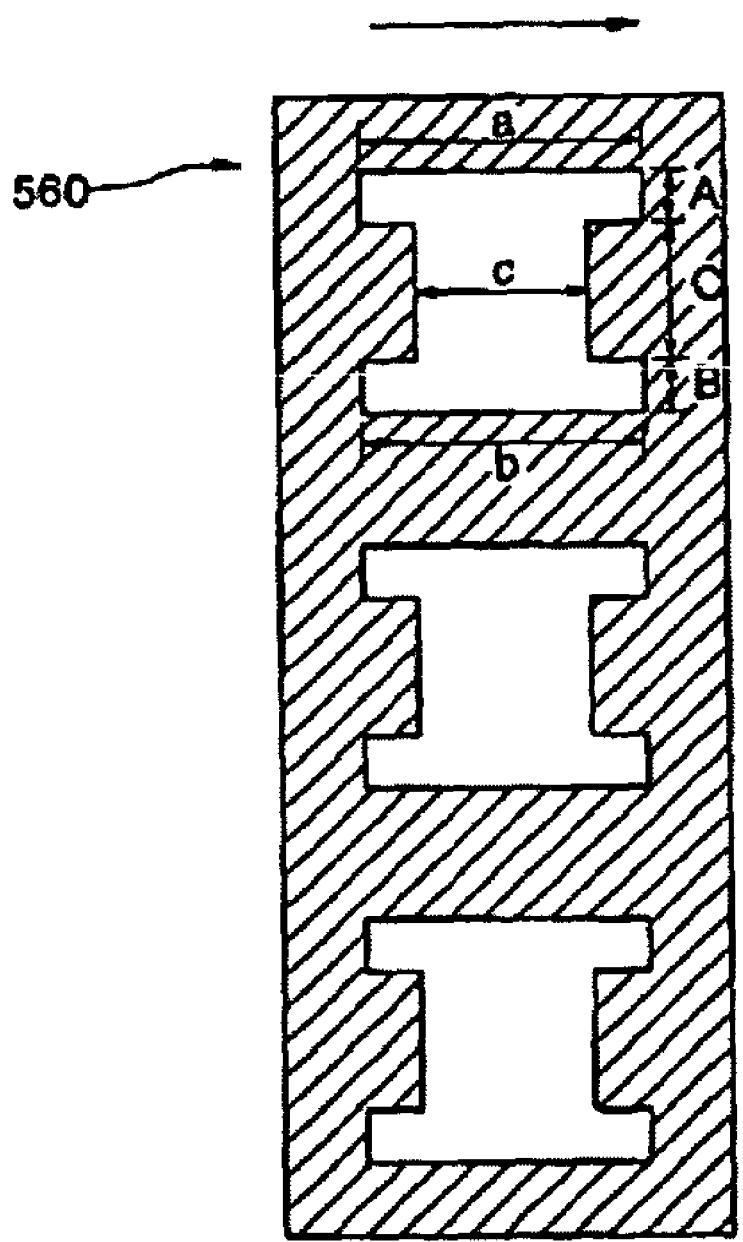

Referring to FIGS. 5A and 5B, a donor substrate 120 where an organic layer 130 is formed is laminated on a substrate 110 where a pixel electrode is formed.

A laser irradiation apparatus 500 includes a laser generator 540, a patterned mask 560, and a projection lens 570. The laser generator 540 irradiates a laser beam 550 onto a predetermined region of the donor substrate 120, and performs scanning in an arrow direction. In this case, the laser beam 550 irradiated from the laser generator 540 penetrates the patterned mask 560, and is focused by the projection lens 570 to be irradiated onto the donor substrate 120. The laser beam 550 is blocked from a portion where the mask 560 is not patterned.

When the scanning direction is a reference of the patterned mask 560, the lengths a and b of the upper and lower portions of the mask pattern are longer than the length c of the middle portion of the mask pattern.

Figure 5C:
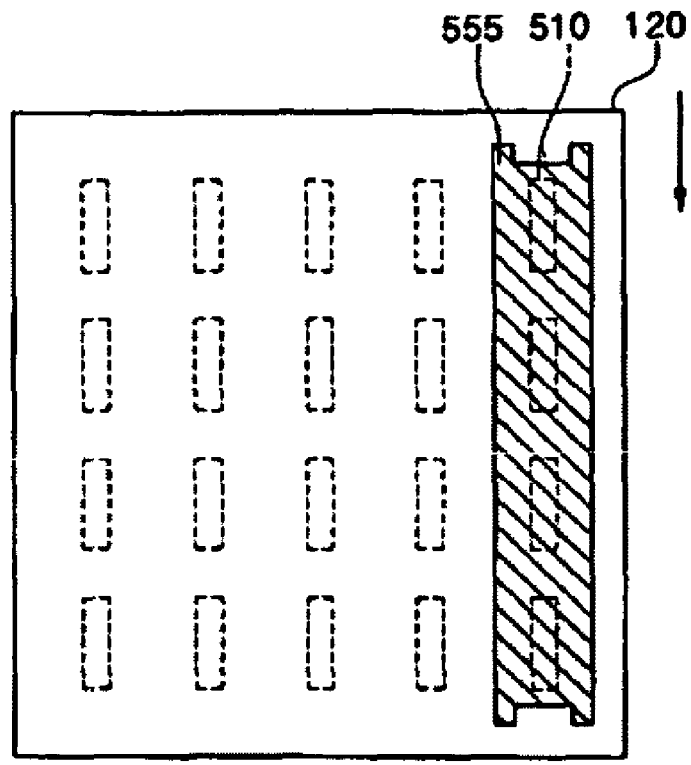

Referring to FIG. 5C, the laser beam 550 is scanned on the donor substrate 120 including the region where the pixel electrode 510 is formed. An oblique line portion indicates a region where the laser beam 550 is scanned.

Scanning of the laser beam 550 allows the organic layer 130 on the donor substrate 120 to be transferred onto the substrate 110 where the pixel electrode 510 is formed.

The process of forming the organic layer pattern may be carried out in an $N_2$ atmosphere. As the organic layer pattern to be transferred may be oxidized in an atmosphere containing oxygen, the transfer process may be carried out in the $N_2$ atmosphere where the oxygen component is removed.

In addition, the transfer process may be carried out in a vacuum atmosphere, which may advantageously suppress bubbles from occurring between the donor substrate and the substrate when a process of laminating the donor substrate onto a surface of the substrate is carried out.

The organic layer pattern may be a single layer or a multi-layer of at least two layers selected from a group consisting of an emission layer, a hole injection layer, a hole transport layer, an electron transport layer and an electron injection layer.

After the transfer process is carried out, a cathode is formed on the organic layer pattern which is already formed, thereby completing formation of the organic light emitting display.

Figure 5D:
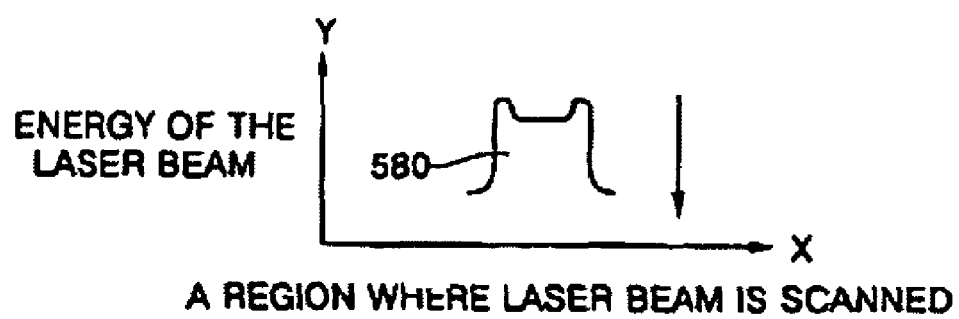

Referring to FIG. 5D, an amount of laser irradiated on a scanning region while the laser beam performs scanning is shown as a beam profile 580 of the laser beam 550 irradiated on the donor substrate 120. An x-axis indicates a region where the laser beam is scanned and a y-axis indicates energy of the laser beam. To detail this, as the amount of laser beam energy irradiated on the scanning region of the donor substrate 120 is not uniform, it can be seen that an energy amount of the laser beam 550 irradiated on the region scanned through the upper portion A and the lower portion B of the mask pattern is larger than that irradiated on the region scanned through the middle portion C of the mask pattern. The energy at the region scanned through the upper portion A and the lower portion B of the mask pattern is used to break the bonding within the organic layer 130, and the energy at the region scanned through the middle portion C of the mask pattern is used to allow the organic layer 130 to separate from the donor substrate 120 and be transferred.

Figure 1:
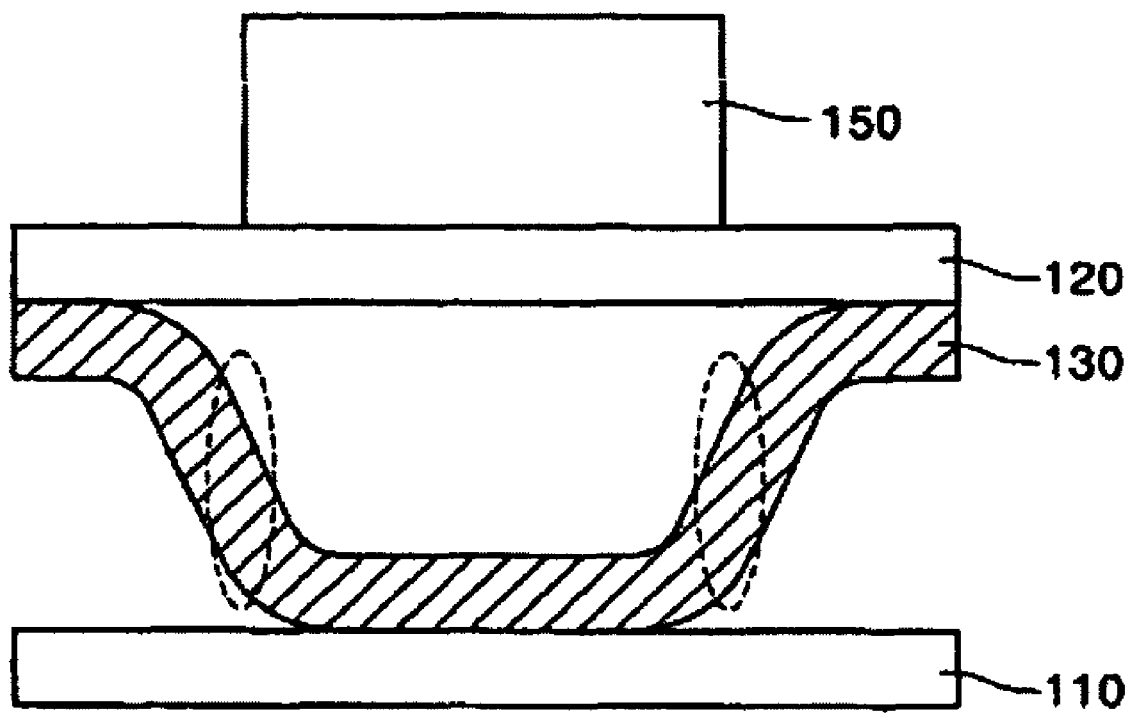
FIG. 1 is a cross-sectional view illustrating a method of forming an organic layer pattern using an LITI method.
Figure 2A:
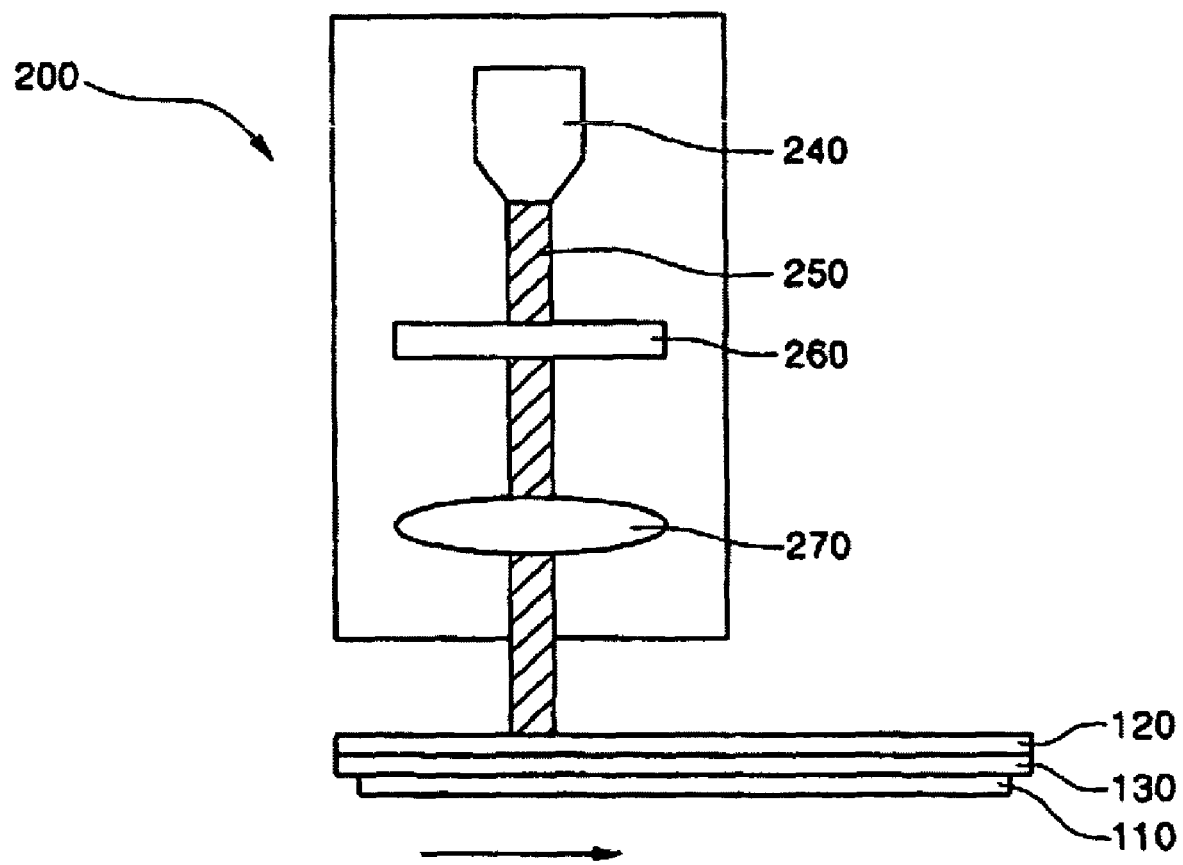
FIGS. 2A to 2C are schematic views illustrating a method of fabricating an organic light emitting display using a conventional laser irradiation apparatus.
Figure 2B:
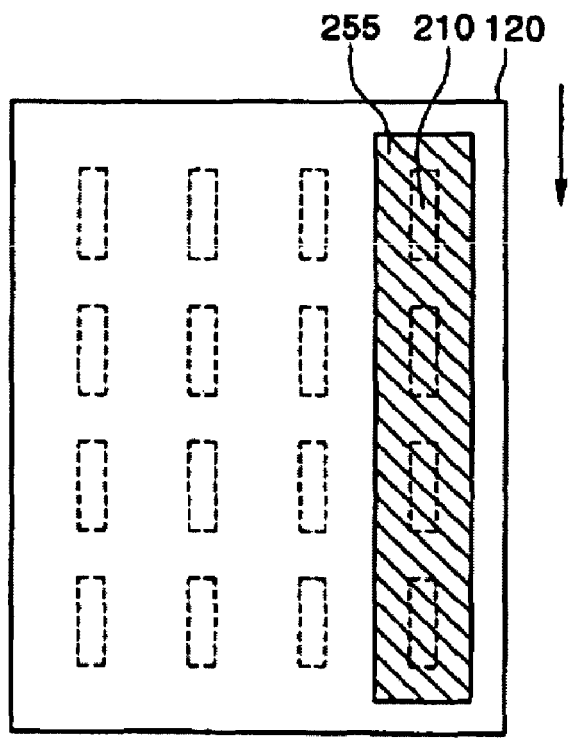
Figure 2C:
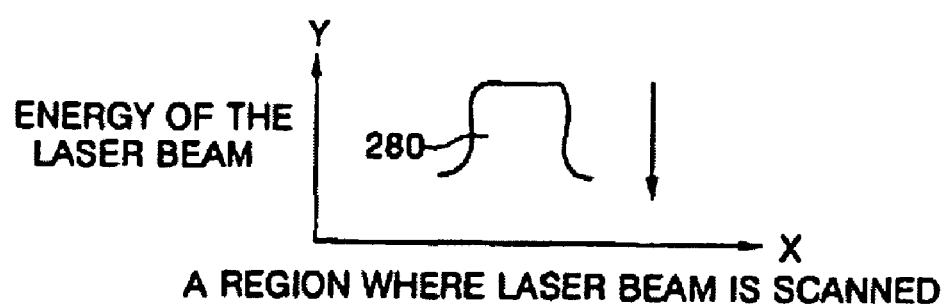

As described with reference to FIG. 1, the energy required for breaking the bonding within the organic layer 130 is higher than the energy required for allowing the organic layer 130 to be separated from the donor substrate 120 and transferred.

Accordingly, when only energy required for allowing the organic layer 130 separated from the donor substrate 120 and transferred is applied to the donor substrate 120, the bonding within the organic layer 130 may be broken and the organic layer 130 may be separated from the donor substrate 20 and transferred. That is, the organic layer pattern may be formed using a laser beam having low energy, which leads to an enhancement of the laser beam. In addition, the low energy is applied to the organic layer, so that the organic layer pattern may be less damaged by the laser beam having the low energy.

According to the present invention as mentioned above, when the organic layer pattern is formed using the LITI method, the mask is formed such that lengths of the upper and lower portions of the mask pattern are formed longer than the length of the middle portion of the mask pattern with respect to a scanning direction, and the laser beam is irradiated through the mask. Accordingly, the organic layer may be transferred using a laser beam having low energy, and the laser beam efficiency may be enhanced. In addition, the organic layer may be less damaged, and the quality of the organic layer pattern to be pattern may also be enhanced.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display, comprising:
   providing a substrate where a pixel electrode is formed;
   laminating a donor substrate on an entire surface of the substrate; and
   scanning a laser beam on a predetermined region of the donor substrate using a laser generator and a mask positioned below the laser generator to form an organic layer pattern on the substrate,
   wherein lengths of an upper portion and a lower portion of the mask are patterned longer than a length of a middle portion of the mask pattern with respect to a scanning direction.

2. The method as recited in claim 1, wherein the mask pattern has a I shape.

3. The method as recited in claim 1, wherein the mask pattern is shaped such that at least one side of the mask pattern is opened.

4. The method as recited in claim 3, wherein the mask pattern is formed to have any one shape of ⊏, ⊐, ⊏ and ⊐.

5. The method as recited in claim 1, wherein the mask is patterned except a center of the middle portion of the mask pattern.

6. The method as recited in claim 1, wherein forming the organic layer pattern on the pixel electrode is carried out in a nitride ($N_2$) atmosphere.

7. The method as recited in claim 1, wherein forming the organic layer pattern on the pixel electrode is carried out in a vacuum atmosphere.

8. The method as recited in claim 1, wherein the organic layer pattern is a single layer or a multi-layer of at least two layers selected from a group consisting of an emission layer, a hole injection layer, a hole transport layer, an electron transport layer and an electron injection layer.

* * * * *